March 28, 1967 B. D. GRAY 3,311,798

COMPONENT PACKAGE

Filed Sept. 27, 1963 3 Sheets-Sheet 1

INVENTOR.
BILLY D. GRAY,
By HIS ATTORNEYS
Spensley & Horn

INVENTOR.
BILLY D. GRAY,
By HIS ATTORNEYS
Spensley & Horn.

March 28, 1967 B. D. GRAY 3,311,798

COMPONENT PACKAGE

Filed Sept. 27, 1963 3 Sheets-Sheet 3

BILLY D. GRAY,
INVENTOR.

By His Attorneys
Spensley & Horn 3,311,798
COMPONENT PACKAGE
Billy D. Gray, Torrance, Calif., assignor to TRW Semiconductors, Inc., Lawndale, Calif., a corporation of Delaware
Filed Sept. 27, 1963, Ser. No. 312,200
8 Claims. (Cl. 317—234)

This application is a continuation-in-part of a copending application Ser. No. 267,167, now abandoned, filed on Mar. 22, 1963, in the name of Billy D. Gray, and entitled, "Component Package."

The present invention relates to improved microminiaturized encapsulated electronic components, and more particularly to improvements in the thermal and electrical properties thereof and in the further simplified miniaturization thereof.

Within the technical world, as elsewhere, the cost of space is rising drastically. One aspect of this is the tremendous cost of adding a few extra cubic centimeters volume to a missile component package. It may cost millions of dollars to lift and maintain this extra volume along with the added structure necessary to mount and adapt it to the existing package. Hence, electronic engineers exert almost as much effort to miniaturize a component, without altering its function, as in the initial design of the component. For this and other reasons, it is important to reduce the cross-sectional thickness of a semiconductor and other electronic packages. The present invention accomplishes such a reduction, decreasing the ratio of package height-to-seating plane diameter by over five times in certain cases. This reduction is especially significant for such applications as printed circuit boards, and the like, which have critical thickness dimensions, since the height of a semiconductor package is often the largest on the board and thus controls the minimum board spacing.

Hand-in-hand with dimensional criticality goes the thermal performance of a packaged component. It is obvious that close spacing results in the aggravation of heat-dissipation problems, since the insulation distances and dissipation surface are reduced, while the cooling problems and attendant cooling-poundage necessarily increase. Thus, if a component package is radically miniaturized, it is highly likely that the package will have an inferior "heat-dissipation capability" rating. The present invention not only avoids reduction of this rating, but actually increases it. The invention accomplishes this by providing better thermal-dissipation paths, fewer surface-interfaces, and improved thermal arrangement of elements. For example, one 10 ampere package has been improved to a thermal resistance of only 1° C./Watt compared with a prior art resistance of over 10° C./Watt. The use of thermally-conductive substrates according to the invention is a significant cause of this improvement.

Progress in the art of miniaturization has been marked by the increase of fabrication costs due to the greater complexity of the parts and the materials involved. The present invention solves the miniaturization problem by a design which, also effects a decrease in fabrication costs by reducing the number and complexity of parts and by reducing the types of materials used. The invention further provides a compact package which is simpler and cheaper to fabricate. The inventive package is also easier to attach to a chassis for good heat dissipation. Shorter leads having less volume and weight, and better lead-materials entirely of copper (versus prior art nickel alloys) contribute to this. Also simpler fabrication and reduction in the types of metals enables a higher production yield, allows for replating of rejects with one uniform coating, and aids in reducing costs. Also involved in the inventive teaching is the cold-welding of the package to provide a final hermetic seal thereto. This protects the semiconductor device in the package from metallizing and vaporous metal contamination which invariably occur during conventional resistance welding.

Among the many other functions a component package must perform is that of sealing and protecting the encapsulated component from contact with foreign matter. This requires a true hermetic seal. However, this is very difficult to render in prior art glass using packages because a meniscus is formed adjacent to the lead-to-glass seal interface surface, preventing an adequate bonding of the edges to provide reliable hermetic seals. The ceramics prescribed according to the present invention overcomes the meniscus problem by substituting a metallic meniscus for one of glass, and thereby effecting better hermetic sealing.

A related problem has resulted from the resistance welding of prior art packages to seal them, frequently causing injury to the thermally sensitive components within, such as transistors. Hot sealing also released gases, etc. which could contaminate components within the package. Weld splatter also frequently contaminated components. The invention eliminates these problems by allowing an intermetallic bond without attendant interfacial heating. Moreover, the provision of a buffer ring in sealing the cap to the header, compensates for mismatch in manufacture and additionally increases bond strength.

Prior art packages also suffered from interior adaptation to, and performance in, magnetic environments. This was because they have employed iron and nickel-bearing alloys which are magnetizable and thus able to distort magnetic fields and provide for a magnetic source when one is not wanted. This is very undesirable, for instance, in space probes and similar instruments used to measure small magnetic fields. The present invention eliminates this problem by providing a component package which does not require such magnetic materials and thus enables one to produce a package which is essentially nonmagnetic.

Another very common problem with prior art transistor packages has been power loss characteristics with increased operating frequencies. Prior art packages have used such poor high frequency conductors as nickel or iron alloys for leads and structural members. Moreover, lead, etc. type additives have been employed in the glass seals. The present invention eliminates these and other materials problematical for RF operation. This allows the inventive package to extend the useful RF range, for instance, of a 2N2525 transistor with a 5 watt output from a prior maximum frequency of 70 mc. to as high as 500 mc. The correct utilization of ceramics instead of such materials as glass, etc., also contributes to improved RF performance.

Another related problem at high frequency operation has been effective "lead inductance." This is a function of lead length and cross-sectional area. The present invention, in reducing lead length, for instance, from 150 mils to 30 mils in one package embodiment, has vastly minimized this problem. In contrast, the prior art has often been forced to use dual emitter and base leads to overcome this problem.

Thus, as above mentioned, the method of encapsulation herein described has solved the problems in prior art encapsulations by providing: more efficient heat dissipation per package volume; smaller package height for a given package cross-section; wider, easier to manipulate contacts; increased range of high frequency operation; improved magnetic performance; greatly reduced number of package elements and of different package materials, thereby reducing the cost and difficulty of fabrication and the cost and difficulty of sealing the package elements, while eliminating the danger of heat injury to components during fabrication; and further providing a package with a superior seal and wider mounting versatility. These advantages will be more particularly described hereinafter, but it is significant to note that the thermal advantages are achieved by a radical shortening of the thermal paths and reducing of thermal resistance, using either thermal conductors, while the high frequency electrical impedances are reduced by the shortening of effective lead length and elimination of poor high frequency conductors.

It is therefore an object of the present invention to provide improved microminiature component packages and more specifically to provide improved miniaturized semiconductor encapsulations.

Another object of the present invention is to provide improved semiconductor mounting and encapsulating methods.

It is yet another object of the present invention to provide a microminiaturized semiconductor encapsulation capable of high power dissipation.

It is also an object of the present invention to provide semiconductor encapsulations having greatly reduced package height-to-seating plane diameter ratios.

It is yet another object of the present invention to provide improved semiconductor encapsulations wherein the structural elements are arranged so as to provide a short thermal path from the semiconductor component to the seating plane heat sink.

It is still another object of the present invention to increase the "heat dissipation over volume" rating of a component package.

It is still another object of the present invention to provide an encapsulated semiconductor device having improved terminals with better thermal, electrical, and mechanical properties.

It is yet another object of the present invention to provide a miniaturized component package having a greater simplicity in parts and in arrangement so as to involve more convenient, inexpensive fabrication techniques.

Still another object is to provide a semiconductor encapsulation using materials which are more suitable, both for fabrication and for operation of the encapsulated device.

Still another object is to provide a semiconductor encapsulation using fewer materials.

Still another object is to provide a compact encapsulated semiconductor device having terminals of a proportionately large cross-sectional area.

Yet another object of the present invention is to provide a compact component package wherein the parts can be joined therein without the generation of heat and the attendant release of gases such as to damage the contents.

A still further object is to provide an encapsulated semiconductor device having greater utility for high frequency operation.

Another object is to provide an encapsulated semiconductor device, the effective lead inductance and lead lengths of which are greatly reduced.

Yet another object is to provide an encapsulated semiconductor component dispensing with glass materials and using more easily bonded, thermally superior conductive ceramics.

Yet another object is to provide an encapsulated component having applicability in magnetic environments.

The objects of the present invention are accomplished using an encapsulation base comprising a thermally conductive ceramic disk on which the component is mounted, through which the lead pins are directed, in the plane of which wide connecting terminals extend, and which presents top and bottom surfaces which are readily joined to a chassis and easily sealed to any convenient planar surface. Thus, a ceramic substrate is provided which at once supports and electrically insulates the component and all connectors, while hermetically sealing the leads and header to the package, and provides a short conductive path for heat dissipation, and a reduction in package height and complexity.

Other objects and purposes of the present invention as taught herein and more particularly described hereinafter will be apparent to those skilled in the art, especially in reading the following more particular description and examining the drawings attendant therein, in which.

For a more complete understanding of the advantages to be had in the practice of the present invention, an understanding of the encapsulation of transistors as taught by the prior art will be helpful.

Figures 1, 2, 3, 4, 5, 6:
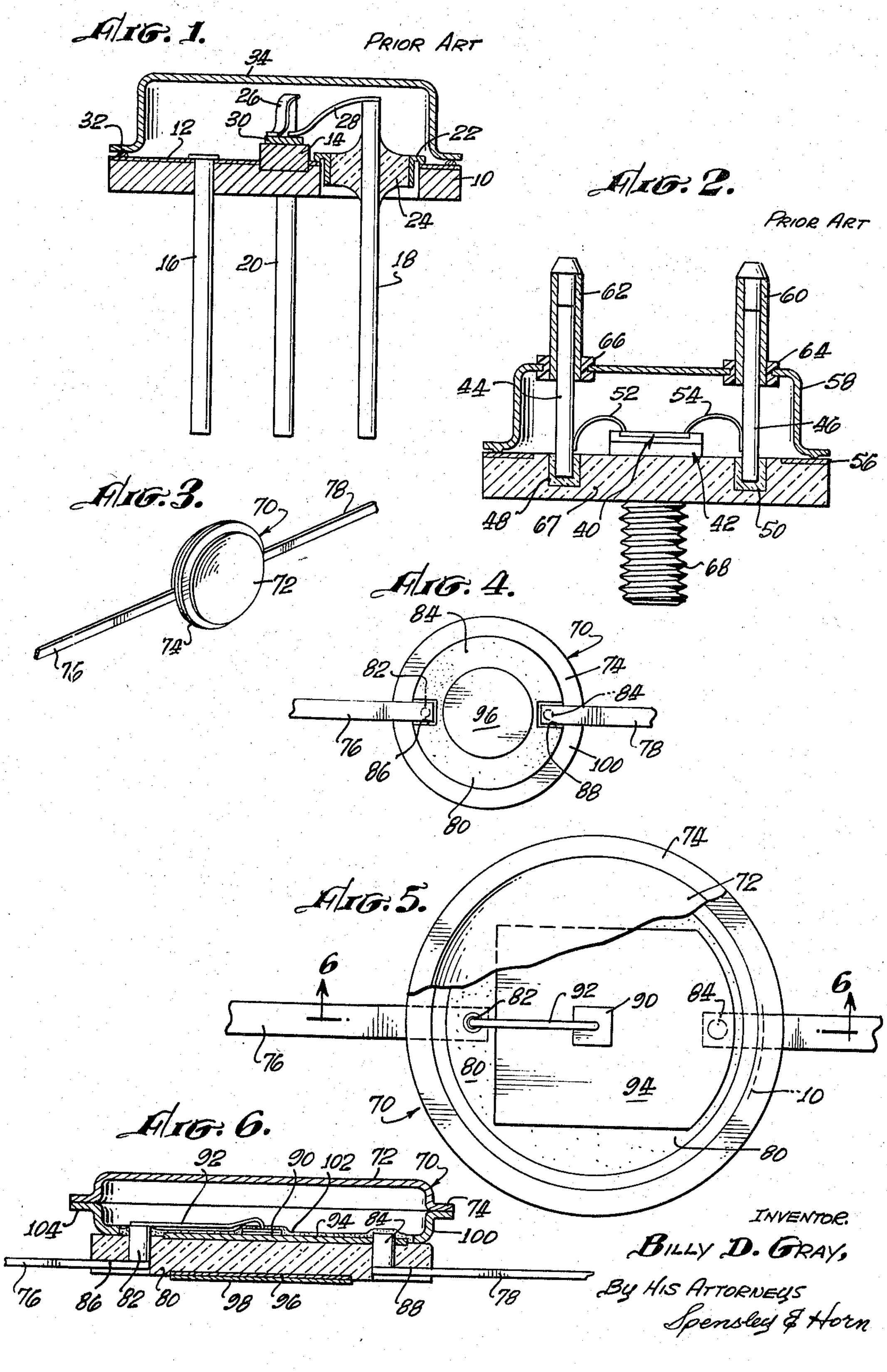
FIGURE 1 is a side elevational view in cross-section showing a prior art encapsulation.
FIGURE 2 is a side elevational view in cross-section showing an alternative prior art encapsulation.
FIGURE 3 shows a perspective view of a component encapsulation, including output terminals, in accordance with one embodiment of the present invention.
FIGURE 4 is a bottom view of the encapsulation shown in FIGURE 3.
FIGURE 5 is a top view somewhat enlarged and, partly broken away, of the encapsulation shown in FIGURE 3.
FIGURE 6 is a cross-sectional view, taken along the line 6—6 of FIGURE 5.

Referring now to the prior art device shown in FIGURE 1, there is shown a header 10 preferably of tellurium-copper. This header is clad with low carbon steel on its top surface 12. Recessed in the top surface to a counterbore depth exceeding the thickness of the steel cladding is a molybdenum heat spreader 14 which is nickel clad on each side. Extending through header 10 and brazed thereto is a Kovar/Rodar type of nickel-iron-cobalt pin 16. Pin 18 and a similar pin 20 also extend through header 10, but are electrically insulated therefrom while having a hermetic seal therebetween. As shown in connection with pin 18, this is done with a metallic ring 22 having a larger inner diameter than the diameter of the pin 18. Between the ring 22 and pin 18 is the insulation, such as glass 24, bonded therebetween. Seal ring 22 may be brazed on the base 10 in raised or flush position. Pins 18 and 20 extend upwardly beyond the glass seal 24 to support leads 26, 28 which in turn make suitable contact to the transistor 30 mounted on top of heat spreader 14. On top of the steel clad surface 12 is a coined annular weld projection 32 to which may be welded a steel cap 34.

The disadvantages of prior art encapsulations will be apparent from a consideration of the types of materials used. For example, the cover is steel and the copper header has a steel coating thereon, whereas the pins and base are of nickel alloys, and glass or other vitreous material is used for seal 24. As earlier noted, it is very difficult to plate an inert material, such as gold, as a supercoating to a composite material package, since the joining problems are different for each metal and they require a plurality of different cleaning, sensitizing and plating operations and may render deplating and replating impossible.

In addition, there are electrical disadvantages, particularly in high frequency operation. The ferrous and nickel materials are poor high frequency conductors and limit the operation of the components connected thereto. These materials also inhibit the switching speed of the components of high frequencies and their magnetic applicability.

In a manner similar to the prior art shown in FIGURE 1, FIGURE 2, illustrates an alternative prior art encapsulation embodiment. The advantages of the present invention may be more clearly perceived hereinafter by comparison therewith. Reference is now made to the prior art device in FIGURE 2 wherein, in the embodiment shown, the component 40 is mounted upon ceramic substrate 42 which is attached to copper base 67 having embedded therein connecting pins 44 and 46. These pins are insulated from the copper base with glass insulators 48, 50. Connectors 52, 54 interconnect the connecting pins 44, 46 with the front contacts of component 40. Welding ring 56 is conventionally of a ferrous metal and is bonded to the periphery of the copper base 67. This combination forms the base of the encapsulation. Cap 58 generally comprises the cup-shaped member having hollow connector tubes 60, 62 fixedly and insulatingly mounted therein through glass-to-metal seals 64, 66. It will be noticed in connection with the connector tubes 60, 62 that a hermetic sealing of these tubes at the outer ends thereof is necessary in order to maintain the seal of the package to which they are connected. The encapsulation base is joined to the cap member by the superposition of the cap over the base so as to index the pins 44, 46 firmly within the connector tubes 60, 62 and fit the neck of the cap 58 onto the welding ring 56 for joining therewith. Bolt 68 serves as a mechanical support and thermal heat sink when fastened within a chassis frame (not shown).

This alternative prior art configuration has many disadvantages which are overcome by the present invention. These include too great a number of elements and different materials, such as nickel, glass, and ferrous materials which degrade performance; problems in fabricating and in mounting upon the chassis; as well as thermal dissipation problems. For instance, welding ring 56 and cap 58 are conventionally of steel, while tubes 60, 62 and pins 44, 46 generally comprise a nickel alloy.

The limitations upon high frequency operation are even more serious in the prior art embodiment illustrated in FIGURE 2 since wide expanses of poorly conductive materials, such as nickel tubes 60, 62, nickel pins 44, 46, steel cap 58, and ring 56 all present substantial impedances along which RF skin currents may proceed. This introduces an electrical delay into the connector circuit to component 40, as well as possibly causing heat generation. If component 40 is a transistor, as it often is, the deletion of these ferrous materials will radically increase the transistor switching speed since the ferrous elements act as a choke at the high frequencies, appearing as a delay line in the output circuit. Another high frequency disadvantage, as mentioned above, that has been radically reduced by the present invention, is the effective lead length from the transistor die 40, for instance, to the outside connections of the package. It will be evident that a package such as in FIGURE 2 will present a longer effective lead length and, hence, a higher lead inductance, introducing undesired impedances into the connection line at high frequencies. The effective lead length of the embodiment in FIGURE 2 would be about 0.6 inch, for instance, as opposed to the average 0.1 inch possible in the embodiment shown, for instance, in FIGURE 3.

It might be assumed that the impedances added and the skin effect introduced by the longer effective lead lengths, and the poorly conductive materials might be largely eliminated by the conductive superplating applied to the encapsulation package, for instance, of gold or silver, both good high frequency conductors. This might occur if these noble metals were readily plated to the different materials noted in these prior art packages. However, while these materials plate readily to the copper surfaces, presented in the invention, they are much more difficult to plate to the nickel and ferrous metal surfaces in the prior art packages shown here and economically impossible to plate inside of tubes 60, 62.

Hence, in eliminating the nickel and ferrous surfaces presented to the exterior of the encapsulation package, the present invention eliminates the plating problems associated therewith. It will be evident that it is extremely difficult to plate consistently to a plurality of different metal surfaces on the same package at the same time. Such problems as differences in contact potential, in reaction to cleaning solutions and to sensitizers, and in the deposition of the gold or silver itself, will be evident to those skilled in the art. This plating problem in the prior art introduces the further disadvantage of difficulty in reclaiming parts by deplating the exterior of a defective package, for instance, to replate it satisfactorily. The problem in plating should be noted as relating not only to electrical properties, but also to sealing properties since the noble metals superplated on the package also serve to resist corrosion of the package and the leads thereto by such materials as salt water, moisture, and acids which are an environmental problem typical in encapsulation environments.

Reference is now made to the embodiment of the present invention shown in FIGURES 3–6. This embodiment comprises an encapsulating package 70 having a top cap 72 from which there extends a bonding flange 74, and having wide coplanar output terminals 76 and 78. It will be noted that the general plan of the package is to reduce the ratio of package height-to-seating plane diameter, the terminals being kept above the seating plane and the necessary electrical path through ceramic insulator base 80 being minimized as to length. The insulator base 80 around which this broad-based encapsulation is built, takes the form generally of a disk having apertured portions through which are inserted terminals 82 and 84. This disk has metallized recesses such as, for example, moly-manganese metallized recesses 86, 88 on its base. As many of these recesses are provided as is necessary to accommodate the connective output leads, such as 76, 78 which may be, for example, silver-brazed thereto.

The ribbon leads 76, 78 in turn will be as numerous as is necessary to make contact with the terminal elements of the component 90. These radially disposed ribbon leads offer broad conducting areas for attachment to a printed circuit board or similar terminal means and provide good contact and convenience in attachment. Connector pins 82, 84, etc., are in turn connected to the terminals of component 90 through connectors, such as connectors 92 and metallized top portion 94. Connector 94 is shown simply as a flat metallized surface ohmically connected between pin 84 and the base of component 90. Base 80 also has metallized bottom portion 96. These metallized portions 94, 96 serve to provide mounting surfaces for the attachment of the component 90 to the package and the package seating plane to a suitable heat sink surface 98. Insulator base 80 is surrounded on its top edge by an annular header weld ring 100 to which the base is intimately bonded.

Base 80 comprises a heat-conducting ceramic and may be made of beryllia, for instance. Other suitable thermally conductive ceramics would be alumina and steatite, and the like. Base 80 thus has been constructed as an electrical insulator, hermetic seal area, and is also a good heat conductor. On the metallized top 94 of base 80 is mounted the semiconductor component 90 which may be encapsulated by a suitable potting material 102. Component 90 will normally be a source of heat and may comprise, for instance, a transistor, a diode, an integrated circuit, or the like which requires such microminiaturized encapsulation. The heat-producing component 90 is thus in contact with broad heat dissipating areas on both of its seating surfaces, top and bottom. These areas comprise heat-conducting insulator base 80 which may conduct heat to its metallized base portion 96 which in turn may be fused with a metallic plate 98 or any metallic heat sink such as a chassis. Oppositely disposed is the broad expanse of metal cap 72 or any substitute planar surface to which heat may be directed by conduction through the metal parts and, more especially by radiation, and from which a good deal of that heat, in turn, may be dissipated.

In addition to beryllia, the substrate base 80 may comprise any equivalent thermally conductive ceramic, such as alumina, steatite, etc., which is metallized in appropriate areas to provide for the connection of leads, header flange, and die elements. The seating plane can be modified to facilitate various methods of attachment to the heat sink, as will be apparent hereinafter, and may comprise simply the flat, metallized ceramic surface with metallized portion 96 to which a metallic surface, such as copper plate 98, may be joined. For instance, copper disk 98 may be brazed or plated onto this metallized area. Given this metallized base of a proportionately broad area, the package may be attached directly to various heat sinks, for instance, using conventional glues, epoxies, etc., containing a binder of beryllia or alumina powder and having high thermal conductivity. Or a metal plate may be plated or brazed upon the base to which, in turn, chassis attachment may be made, using such brazing or soldering alloys as tin, tin-silver, tin-lead, etc., for joining to a support-heat sink, for instance, to a copper-plated chassis. Conversely, one may attach a screw head to the metallized area and then screw the stud into the heat sink surface or, similarly, bolt the package onto the heat sink.

As an alternative to cap 72, the header 100 may be cold-welded directly to a suitable nonferrous heat sink, such as a copper plate, as used for RF shielding and thereby provide hermetic closure, intimate thermal contact to the radiating surface, and automatic attachment to a chassis. Thus, it will appear that the encapsulation, according to the invention, has extended the area of the heat-producing component 90, providing greater heat dissipation by extending the heat-conducting area in the seating plane of the component. It will be noted especially from FIGURES 4 and 5, bottom and top views, respectively, that the metallized thermal interface plates 94 and 96 occupy an extremely large percentage of the surface area of the package.

Final hermetic closure and sealing of the package 70 is accomplished by cold-welding the cap 72 at its flange 74 upon the symmetrically disposed flange 104 of the header. This eliminates the undesirable results from hot joining processes, such as resistance welding, used in prior art. The heat generated from hot-joining releases gases, metal vapors, and small metal particles within the package enclosure during sealing in the prior arts, all of which constitute undesirable contaminants. The amount and types of these contaminant materials has been an uncontrollable problem heretofore and depended upon such erratic variable as: mechanical tolerances of the weld projection, plating finish, electrode conditions, welder settings, and general operator experience. The present invention eliminates all of these problems by employing a cold welding of the package metal elements. The cold welding is easily achievable because of the provision of upper and lower flanges on the ring 100. That is, the section lying between the flanges deflects during the welding to take up the severe stresses produced which otherwise would crack the substrate 80. The bottom flange provides a sufficiently large bearing area at the periphery of the top surface of substrate 80 such that forces transmitted through ring 100 during welding are kept low so that the substrate 80 will not shear.

In fabrication, the beryllia disk substrate 80 is metallized with materials, such as moly-manganese by silk screening, or vacuum deposition through a mask, for example. Such metallizing allows fusion of the substrate to such metallic elements as the ribbon leads 76, 78 and pins 82, 84, as well as copper header 100, semiconductor disk 90, heat sink interface 96, and of any other suitable metallic parts. It will be noted that both short and long-term stability of the encapsulated component will be improved, thermally and electrically, and according to the inventive package design performance under vibration and shock, for instance in missile applications, should be improved.

It is significant to note that the inventive design offers radical simplification over the prior art. Analogous prior art devices have involved about twice as many functional components, including such things as glass seals, glass insulators, and tubular connectors, all dispensed with by the inventive design. Simplification of materials has also been effected by the inventive design which uses a total of only two materials, namely, a brazed metallized beryllia ceramic for the seals and the substrate, plus copper alone for the other elements, i.e., the metal cap 72, pins 82, 84, and header 100. Analogous prior art devices have required at least five different materials to accomplish this, and often more. The prior art has added such materials as glass for the seals, and nickel and iron alloys for the metallic elements to give them a thermal expansion similar to that of the glass. Besides eliminating the need for these materials, it will be apparent that the elimination of these materials also eliminates problems inherent in their use, such as for example the poor thermal conductivity of the glass used, the different thermal expasion coefficients of the various materials, and the poor electrical (e.g. radio frequency) and magnetic performance of the nickel and iron alloys. Due to the reduction of both components and numbers of materials, the percentage of hermetic seal failures is also reduced. Further, the bond strength of the surface-finish plating (e.g. with gold or any other noble conductor) will be greater because of the reduction in the number of differing materials to which it must accommodate itself. It is far easier and more efficient to plate the noble conductor metal (e.g. gold) to one metal than two or more different alloys. This results both in a lower fabrication cost and in the added ability to reclaim rejects by replating them, simply using only the one uniform gold coating. It will be apparent that the invention provides the first encapsulation design wherein electrical isolation of the semi-conductor device is accomplished by using the same materials to hermetically seal the leads in the package, and provide a die-mounting substrate.

It will also be evident that this arrangement of thin substrate, short pins therein, etc. effects a substantial reduction in internal effective lead length over the prior art, thereby reducing effective inductance, especially at RF operation. This has effected about a five times reduction in internal effective lead length over the prior art whereby the relative distance from component 90 to first terminal, i.e., pins 82, 84 has been reduced and the length of pins 82, 84, through a thinner insulator base 80, has been reduced radically. Within one package embodiment, for instance, this has meant a reduction from an average lead length from 1.8 inches to 0.4 inch. Thus the RF skin effect at frequencies above about 70 mc. is greatly reduced. Eliminating the nickel and iron alloys for connectors and substituting copper alone has also reduced the additional series resistance of the former at frequencies above 100 mc. RF performance has been greatly improved; for instance, using a 2N2525 type encapsulated transistor at power output of about 5 watts, the present invention allows encapsulated transistor operation at a new high of 500 mc. as opposed to the prior art limit of 70 mc.

Figure 7:
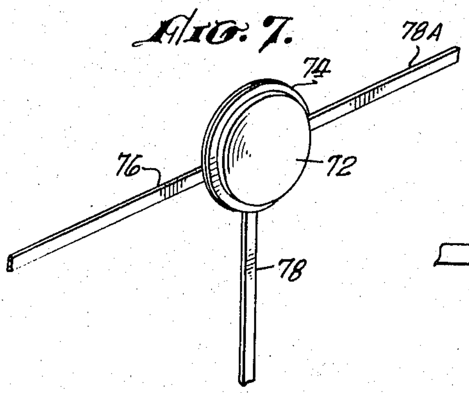
FIGURE 7 is a perspective view of another encapsulation according to the invention.
Figure 8:
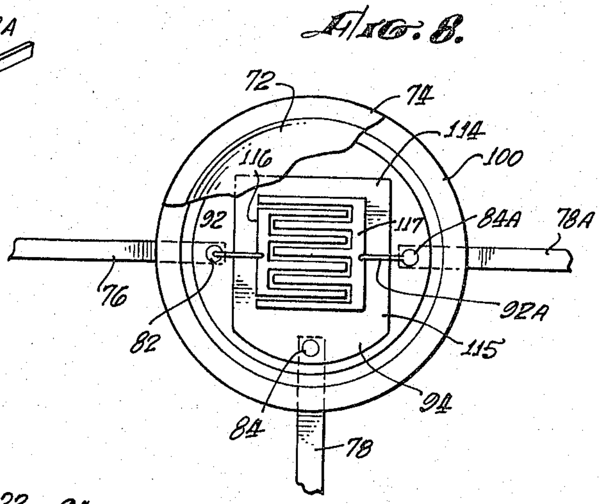
FIGURE 8 is a top view, partly broken away, of the encapsulation shown in FIGURE 7.

Alternative to the embodiments shown in FIGURES 3–6 is a similar semiconductor encapsulation device shown in FIGURES 7 and 8. This encapsulation is, in all ways, similar to that of FIGURES 3–6, except that it is modified to show a greater number of connectors, pins, and terminals, and the connection thereto of a particular transistor component 114 mounted upon the substrate. Transistor 114 has a collector portion 115 connected to terminal 84 through top plate 94, emitter portion 116 connected to terminal 82 through connector 92, and base portion 117 connected to terminal 84A through connector 92A. It will be apparent that a change in the number of connectors, terminals, pins, and leads, such as lead 78A and connector 92A can be made by those skilled in the art without departing from the spirit of this invention.

Figure 9:
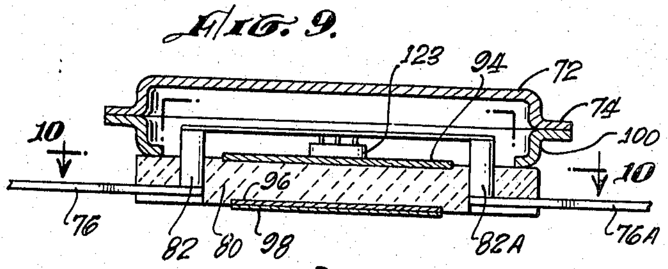
FIGURE 9 is a cross-sectional view of another form of encapsulation.
Figures 10, 11, 12:
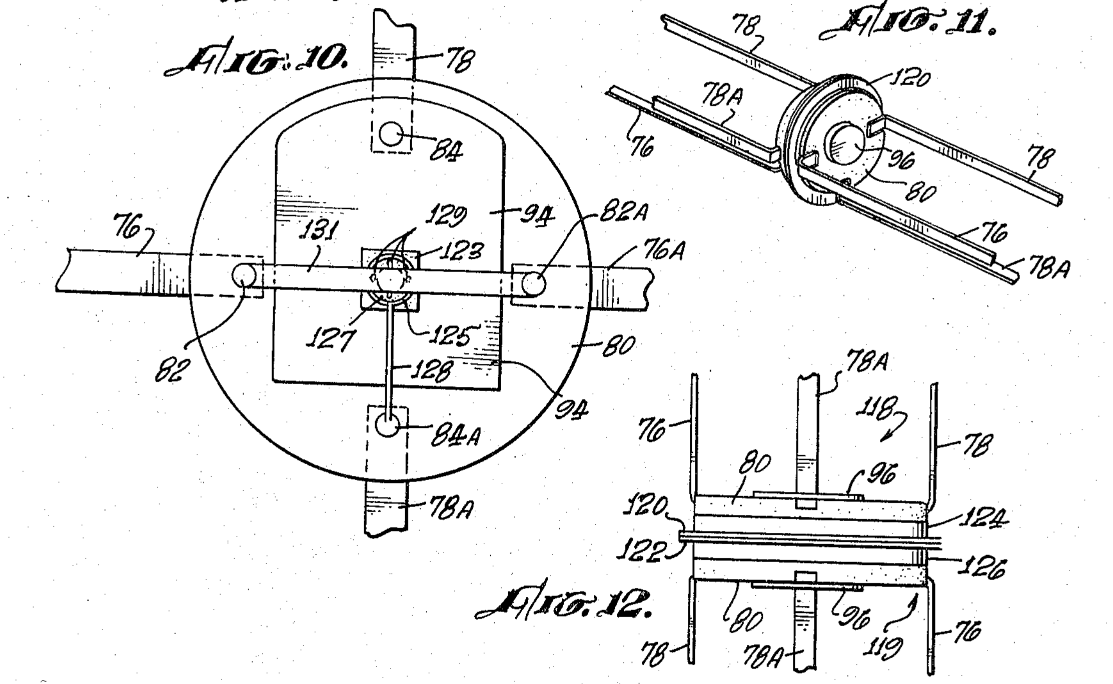
FIGURE 10 is a top view taken along the line 10—10 of FIGURE 9.
FIGURE 11 is a perspective view of a fourth embodiment of the encapsulation according to the invention.
FIGURE 12 is a side elevational view of the encapsulation shown in FIGURE 11.

A modification of the embodiment shown in FIGURES 3–6 is shown in FIGURES 9 and 10. Here, transistor 123 has its collector portion (not seen) connected to terminal 84 through plate 94. Base portion 125, surrounding emitter portion 127, is connected to terminal 84A through connector 128. Emitter portion 127 is connected to terminals 82 and 82A by means of four whiskers 129 nailhead bonded to the emitter portion 127 and welded to strap 131 which interconnects terminals 82 and 82A. The use of lead 76A is optional. This strap 131 is a flat ribbon of gold-plated, oxygen-free, high conductivity copper and the whiskers are gold wires approximately 30 mils long as compared to connectors 92 in the first two embodiments described as being of approximately 150 mils in length. This embodiment is especially useful for transistor operation at frequencies above 100 mc. because of the reduction in lead inductance which is a function of lead length. In addition, shock and vibrational performance characteristics are improved with the shorter leads.

A further novel embodiment of the inventive encapsulation being shown in FIGURES 3–6 is shown in FIGURES 11 and 12, wherein a pair of uncapped encapsulations 118 and 119 may be capped by simply joining the flanged portions 120, 122 of their welding rings 124, 126. It will be noted that the inventive configuration lends itself, and is particularly apt, for this kind of a pair mating arrangement after assembly operations, and that the arrangement offers significant savings in materials, for instance, by eliminating the capped portion 72 in FIGURE 6. In this manner, electrically matched component pairs may be attached for use. The other package elements are otherwise similar to their numbered analogs in FIGURES 3–6. Except for the mated pair arrangement, these elements are essentially the same. It will be apparent that the leads 76, 78, and 78A, for instance, may be disposed normal to the seating planes of the encapsulations 118, 119, as shown in FIGURES 11 and 12. In this way, these leads may serve as mounting and support elements, as well as electrical connectors. However, any suitable alternative orientation and disposition of the leads, for instance, bending them into and parallel with, the seating plane of the encapsulations 118, 119 similar to the dispositions in FIGURES 3–6 lies within the scope of the inventive teaching.

Figure 13:
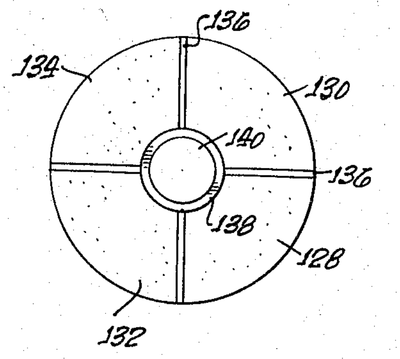
FIGURE 13 is a top view of a fifth embodiment of the present invention.

FIGURE 13 discloses an an alternative lead array wherein the leads comprise pie-shaped conductive sector plates 128, 130, 132, and 134 fused, for instance, by metallizing processes to the bottom face of the conductive ceramic substrate, as were the leads 76, 78, for instance, in FIGURE 3. It will be appropriate to seat these sectors in indented portions, similar to recesses 86, 88 in FIGURE 6 in the substrate. The insulating portions of the substrate will, of course, insulatively separate lead sectors 128, 130, 132, and 134 at, for instance, channel portions 136 and central portion 138, the latter separating the sectors from the bottom portion 140. This portion 140 is generally analogous to stud 96 in FIGURE 11 and is fused to the substrate also. It will be apparent to those skilled in the art that such sector-shaped leads or lead terminals offer extremely broad, easy-to-manipulate connections to be fused, welded or otherwise ohmically connected to external circuits, and that they also offer mechanical stiffening means along the base of the conductive substrate.

Another and significant advantage is that the extremely broad, metallic areas comprising these sectors offer thermally advantageous surfaces since they provide a good radiation and convection surface to dissipate internal heat.

Figure 14:
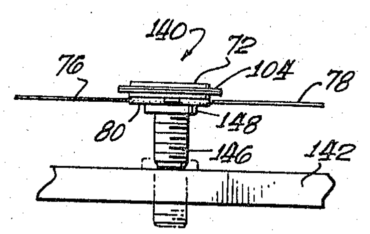
FIGURE 14 is a side elevational view of a sixth embodiment of the invention.

In FIGURE 14 there is shown another embodiment of the encapsulation invention shown in FIGURES 3–6 involving modified means for attachment of capsule 140 to supporting means 142 through threaded connector means 146. The encapsulation 140 is in all respects analogous to that of FIGURES 3–6, having a cap portion 72, a flanged portion 104, external connectors 76 and 78, and substrate 80. Support means 142 may comprise a metallic surface, such as a chassis frame, and provides thermal dissipation, as well as mechanical support. It is threadedly connectible to connector 146 which may, for example, comprise a conventional bolt or machine screw. Connector 146 includes a head portion 148 fusedly attached (e.g. brazed) to the metallized bottom surface of package 140. As an example of the excellent microminiaturization possible with the invention, it should be noted that working versions of the embodiment shown in FIGURE 14 have involved seating thickness of from 0.150 to 0.250 inch, together with diameters of from 0.500 to 0.800 inch. Typical dimensions for ribbon leads 76, 78 in this embodiment would be about 0.045 inch width by about 0.015 inch thick. It will be evident that the inventive encapsulation arrangement may be attached to various other different connective and mounting means without departing from the spirit of the invention claimed herein.

Figure 15:
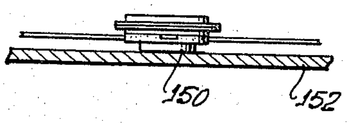
FIGURE 15 is a side elevational view of an embodiment similar to that in FIGURE 14 the mounting plate therefor being shown in cross-section.

Alternatively to the bolting attachment shown in FIGURE 14 is an attachment shown in FIGURE 15. Here disk 150 may be substituted for the bolt head 148 shown in FIGURE 14, this disk 150 being fixedly mounted upon a support means 152 which may serve as the mechanical support and the thermal heat sink. Such a support means may comprise, for instance, a chassis frame. Disk 150 may be of copper and may readily be brazed to the metalized underportion 96 of the conductive ceramic substrate shown in FIGURE 6. Copper disk 150 is then in turn soldered or otherwise fixedly joined to the support means 152 which may comprise a copper chassis, printed circuit board, or similar heat sink material.

Figure 16:
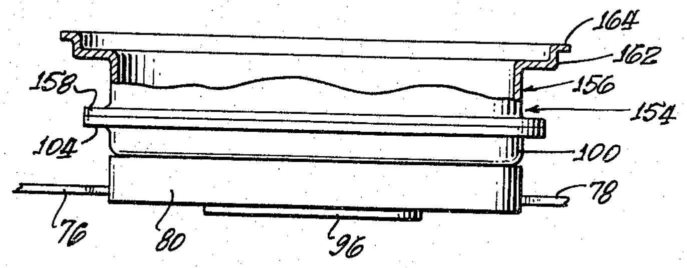
FIGURE 16 is a side elevational partially sectional view of a seventh embodiment of the invention.

Alternative to the cap means 72 shown in FIGURE 6, one may substitute a double-ended cap means 154, as shown in FIGURE 16 (i.e., a double-ended and double-flanged). Thus, cap 154 is like cap 72 of FIGURE 6 in that it is preferably copper and has a tubular cylindrical portion 156, a flanged portion 158 to be hermetically joined to the flange 104 of header ring 100, as discussed hereinbefore. However, cap 154 is closed integrally with cylinder 156 and has added thereto a concave top portion 160 which includes a side member 162 and a flanged portion 164. Flange 164 is provided so that this double-ended cap 154 may be easily joined to any superposed metal heat sink member. The top portion 160, however, is closed at section 156 so as to, itself, provide a hermetically sealed, integral cap over the encapsulated component. Thus, the top portion 160 need not be joined to anything and may be left free, as desired. It may, for instance, be left merely as a joining surface for later optional additions to this part of the breadboard. It will be noted that the added metallic surfaces, and especially the closed copper top portion 156, offer useful heat transfer members for the dissipation of heat generated from within the encapsulation. Dissipation may be enhanced, for instance, by convection air or a coolant over the surface of cap 154. It will also be evident that the double-ended cap 154 offers a convenient means for matching component packages together mechanically so as to produce connected matched pairs of components, and has the advantage of not requiring any hermetic seal at its joining portion 164.

Figure 17:
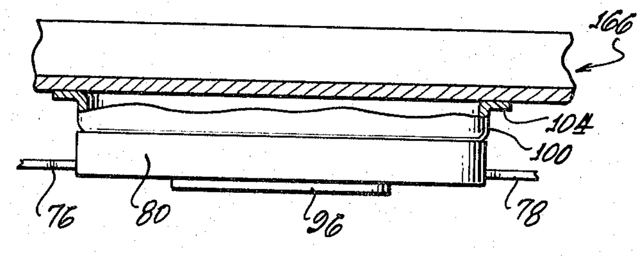
FIGURE 17 is a side elevational partially sectional view of an eighth embodiment of the invention.

A second alternative to cap member 72 in FIGURE 6 is noted in FIGURE 17 wherein planar metallic sheet 166 is provided in its stead. FIGURE 17 thus illustrates how the flanged header ring 100 may be joined at its flanged portion 104 to any suitable capping surface which will both seal and cap the encapsulation package, providing a thermal heat sink and a mechanical support for the encapsulation. Thus, instead of cold welding the cap 72 to the header 100 as in FIGURE 6, heat sink 166 comprising a planar metal sheet of nonferrous material, such as copper, may be cold welded directly to the flange 104 of the header 100. In this manner, for example, a power transistor could be cold welded to a copper plate, such as those used for radio frequency shielding, and thus provide, without any need for a separate cap member, a hermetic closure, an intimate thermal contact to a radiating surface, and a heat sink with immediate attachment to a chassis plate. The alternative cap members shown in FIGURES 6, 16, and 17 will serve to illustrate to those skilled in the art the versatility of the inventive encapsulation means, showing that it is adaptable to many environments and simplifies the needed parts and fabrication materials in these environments, with improved thermal and electric performance of the package.

Further possible applications of the instant invention of improved encapsulation devices and methods, as described hereinbefore, for the improved miniaturized packaging of components with superior thermal and electrical properties and fabrication advantages would be: in encapsulating miniaturized electronic components, electrical devices, chemical devices, and mechanical devices wherein the problems of size, simplicity of packaging and hermetic sealing thereof, together with mechanical, thermal, and electrical superiority are desired.

While the invention has been particularly shown and described with reference to the preferred embodiments thereof, it will be understood by those skilled in the art that various changes in form and details, in constituents and steps, in concentrations and ranges may be made without departing from the spirit and scope of the invention.

What is claimed is:

1. A hermetically sealed miniaturized component package comprising:

a ceramic substrate member, said substrate member having a top surface, a bottom surface, and a plurality of apertured portions through the cross-section thereof;

a plurality of pin members fixedly mounted in said apertured portions and extending beyond said surfaces;

an electronic device fixedly mounted upon said top surface and having electrical connectors ohmically attached thereto;

at least one of said connectors being attached to one of said pins;

a flat ribbon strap interconnecting a pair of said pins; said strap extending in spaced relationship above said electronic device;

other of said connectors being attached to said strap;

a plurality of lead members, each attached to one of said pin members at the portion thereof adjacent said bottom surface so as to extend radially away from said package;

a conductive metallic circular member fused to the top surface of said substrate, said circular member having a flanged portion at one end thereof; and a metallic cap member sealed to said circular member so as to provide a hermetically sealed enclosure.

2. A hermetically sealed miniaturized component package comprising:

a ceramic substrate member, said substrate member having a top surface, a bottom surface, and a plurality of apertured portions through the cross-section thereof;

a plurality of pin members fixedly mounted in said apertured portions and extending beyond said surfaces;

an electronic device fixedly mounted upon said top surface and having electrical connectors ohmically attached thereto;

at least one of said connectors being attached to one of said pins;

a flat ribbon strap interconnecting a pair of said pins; said strap extending in spaced relationship above said electronic device;

other of said connectors being attached to said strap;

a plurality of lead members, each attached to one of said pin members at the portion thereof adjacent said bottom surface so as to extend away from said package; and a metallic cap member providing a hermetically sealed enclosure with said substrate member.

3. A hermetically sealed miniaturized component package comprising:

a ceramic substrate member having a top surface, a bottom surface and an apertured portion therebetween, said top surface being metallized over a portion thereof;

a pin fixedly mounted in said apertured portion and extending beyond said top surface;

an electronic device fixedly mounted upon said top surface and having an electrical conductor connected to said pin;

a lead member ohmically connected to said pin member and arranged to extend from said package;

an annular metal member having radially extending top and bottom flanges, said bottom flange being fused to said top surface of said substrate bearing substantially entirely upon said top surface; and, a metal cap cold-welded to said metal member at said top flange thereof whereby a hermetically sealed enclosure is created.

4. A device as claimed in claim 3 wherein said cap is a second device as claimed in claim 3, said top flange of said second device being cold welded to said top flange of said device.

5. A hermetically sealed miniaturized component package comprising:

a ceramic substrate member having a top surface, a bottom surface and an apertured portion therebetween, said top surface being metallized over a portion thereof;

a pin fixedly mounted in said apertured portion and extending beyond said top surface;

an electronic device fixedly mounted upon said top surface and having an electrical conductor connected to said pin;

a lead member ohmically connected to said pin member and arranged to extend radially from said package;

an annular metal member having radially extending top and bottom flanges, said bottom flange being fused to said top surface of said substrate bearing substantially entirely upon said top surface; and, a metal cap cold-welded to said metal member at said top flange thereof whereby a hermetically sealed enclosure is created.

6. A hermetically sealed miniaturized component package comprising:

a ceramic substrate member having a top surface, a bottom surface and an apertured portion therebetween, said top surface being metallized over a portion thereof;

a pin fixedly mounted in said apertured portion and extending beyond said top surface;

an electronic device fixedly mounted upon said top surface and having an electrical conductor connected to said pin;

a lead member ohmically connected to said pin member and arranged to extend from said package;

an annular metal member having radially extending top and bottom flanges, said bottom flange being generally at its outer edge configured to the shape of said top surface of said substrate and fused thereto; and, a metal cap cold welded to said metal member at said top flange thereof whereby a hermetically sealed enclosure is created.

7. A hermetically sealed miniaturized component package comprising:

a circular ceramic substrate member having a top surface, a bottom surface and an apertured portion therebetween, said top surface being metallized over a portion thereof;

a pin fixedly mounted in said apertured portion and extending beyond said top surface;

an electronic device fixedly mounted upon said top surface and having an electrical conductor connected to said pin;

a lead member ohmically connected to said pin member and arranged to extend from said package;

a circular metal member having radially extending top and bottom flanges, said bottom flange being generally at its outer edge configured to said top surface of said substrate and fused thereto and bearing substantially entirely upon said top surface; and, a metal cap cold welded to said metal member at said top flange thereof whereby a hermetically sealed enclosure is created.

8. A hermetically sealed miniaturized component package comprising:

a circular ceramic substrate member having a top surface, a bottom surface and an apertured portion therebetween, said top surface being metallized over a portion thereof;

a pin fixedly mounted in said apertured portion and extending beyond said top surface;

an electronic device fixedly mounted upon said top surface and having an electrical conductor connected to said pin;

a lead member ohmically connected to said pin member and arranged to extend radially from said package;

a circular metal member having radially extending top and bottom flanges, said bottom flange being generally at its outer edge configured to said top surface of said substrate and fused thereto and bearing substantially entirely upon said top surface; and, a metal cap cold welded to said metal member at said top flange thereof whereby a hermetically sealed enclosure is created.

References Cited by the Examiner

UNITED STATES PATENTS

| | | | |
|---|---|---|---|
| 2,804,581 | 8/1957 | Lichtgarn | 317—235 |
| 2,817,048 | 12/1957 | Thuermal | 317—234 |
| 2,848,793 | 8/1958 | Pityo | 29—155.5 |
| 2,971,138 | 2/1961 | Meisel et al. | 317—234 |
| 3,020,454 | 2/1962 | Dixon | 317—234 |
| 3,021,461 | 2/1962 | Oakes et al. | 317—235 |
| 3,072,832 | 1/1963 | Kilby | 317—235 |
| 3,115,697 | 12/1963 | Shaver et al. | 29—155.5 |
| 3,119,052 | 1/1964 | Tsuji | 317—234 |
| 3,150,298 | 9/1964 | Andres | 317—234 |
| 3,177,576 | 4/1965 | Kuzminski | 317—235 |
| 3,187,083 | 7/1965 | Grimes | 174—50.5 |
| 3,187,240 | 7/1965 | Clark | 317—235 |
| 3,195,026 | 7/1965 | Wegner et al. | 317—234 |

JOHN W. HUCKERT, *Primary Examiner.*

JAMES D. KALLAM, DAVID J. GALVIN, *Examiners.*

A. M. LESNIAK, *Assistant Examiner.*